United States Patent [19]

Jacobs et al.

[11] Patent Number: 4,821,147
[45] Date of Patent: Apr. 11, 1989

[54] MOUNTING ASSEMBLY COMPRISING AN ELECTRONIC MODULE AND A RACK RECEIVING THE MODULE

[75] Inventors: Brian Jacobs, Palo Alto; Thomas McGaffigan, Half Moon Bay; Edward Cydzik, Foster City, all of Calif.

[73] Assignee: Raychem Corporation, Menlo Park, Calif.

[21] Appl. No.: 105,637

[22] Filed: Oct. 5, 1987

[51] Int. Cl.⁴ .................................................. H05K 7/20
[52] U.S. Cl. ................................ 361/388; 211/41; 439/153; 439/161
[58] Field of Search ............... 211/41, 50; 361/392, 361/395, 399, 413, 415, 386, 387, 388; 165/80.2, 185; 174/16 HS; 439/161, 153, 157

[56] References Cited

U.S. PATENT DOCUMENTS

| | | | |
|---|---|---|---|
| 3,186,554 | 6/1965 | Mack et al. | 211/41 |
| 3,801,954 | 4/1974 | Dorrell | 439/161 |
| 3,970,198 | 7/1976 | Prater | 211/41 |
| 4,480,287 | 10/1984 | Jensen | 361/388 |
| 4,502,601 | 3/1985 | Husted et al. | 211/41 |
| 4,537,454 | 8/1985 | Douty | 439/157 |
| 4,606,591 | 8/1986 | Bloch | 439/157 |
| 4,687,269 | 8/1987 | Dubetret | 439/161 |

OTHER PUBLICATIONS

Machine Design, Jan. 8th, 1987, pp. 115 to 118, Edward Longo.

*Primary Examiner*—Gerald P. Tolin
*Attorney, Agent, or Firm*—Herbert G. Burkard; Simon J. Belcher

[57] ABSTRACT

The invention provides a mounting assembly comprising an electronic module and a rack for receiving the module. The assembly includes an actuator arranged to cause the module to slide along the rack into engagement with an end stop, and subsequently to actuate means arranged to force a surface of the module against a surface of the rack, for example to make a heat sink link. The actuator preferably comprises a shape memory alloy element.

19 Claims, 4 Drawing Sheets

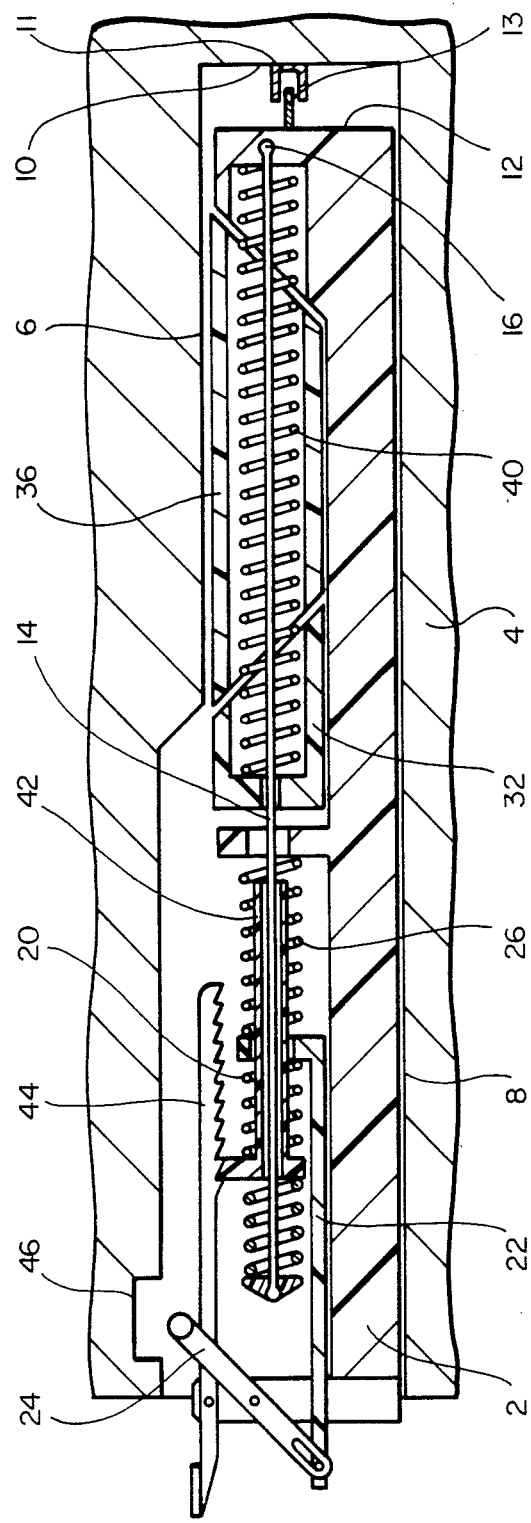
FIG_1

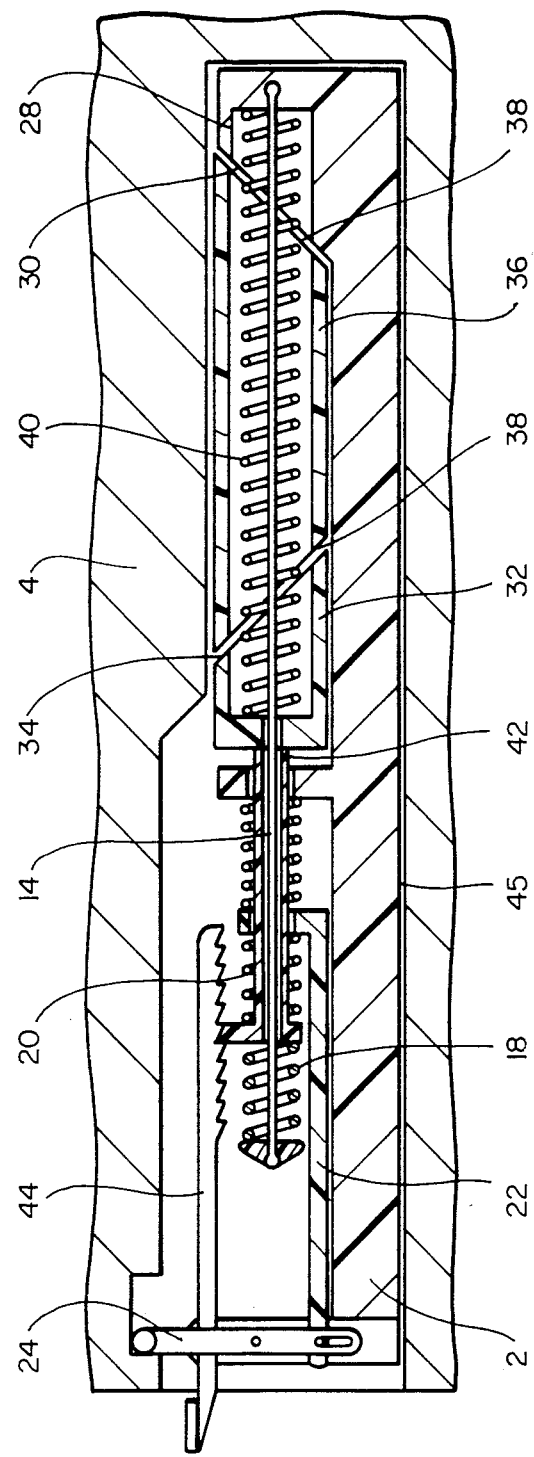
FIG_2

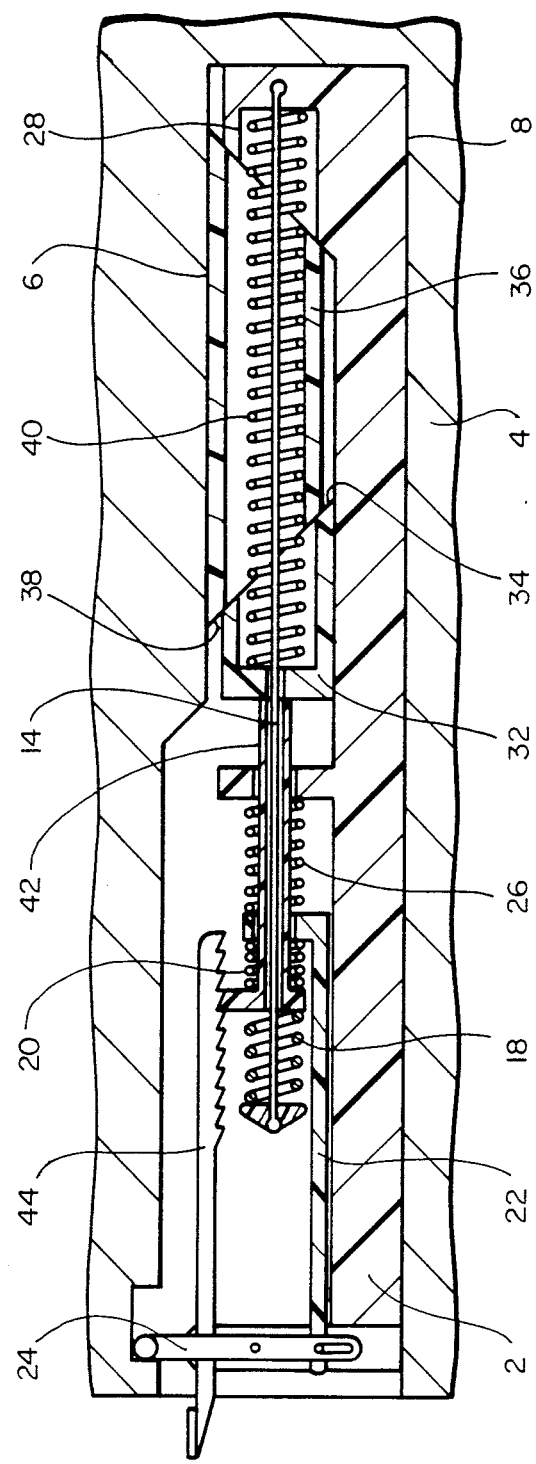

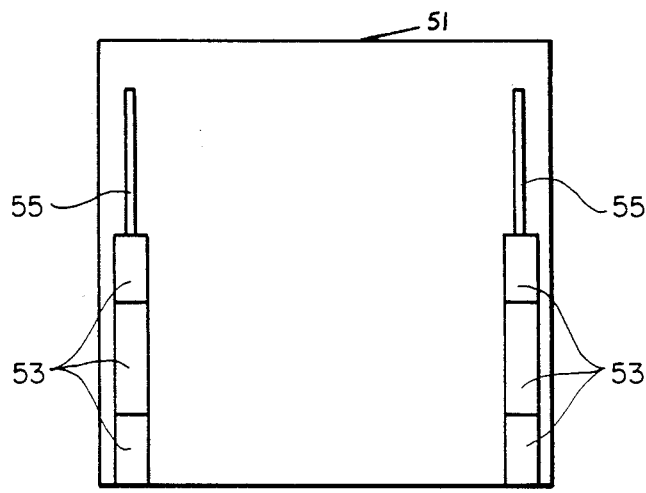
FIG_4
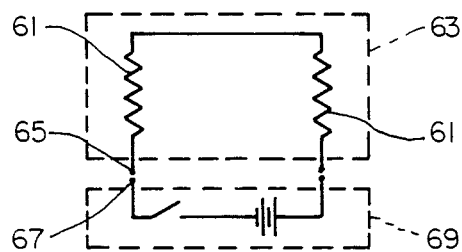
FIG_5
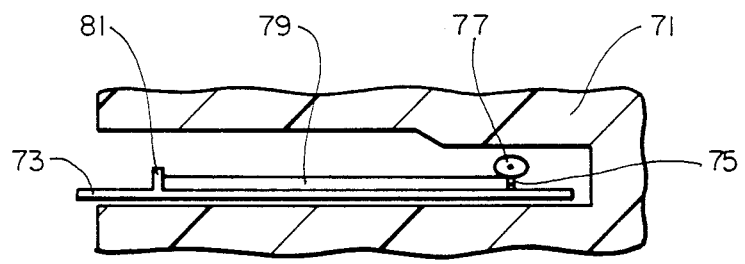
FIG_6

MOUNTING ASSEMBLY COMPRISING AN ELECTRONIC MODULE AND A RACK RECEIVING THE MODULE

BACKGROUND OF THE INVENTION

This invention relates to a mounting assembly comprising an electronic module and a rack for receiving the module, and to an electronic module.

The increased use of electronic components such as electronic chips and integrated circuits mounted on printed circuit boards, or otherwise, has led to pressure to reduce the space which is occupied by the components and their associated mounting assemblies. Components which are packaged as printed circuit boards, or otherwise, are therefore often mounted in a rack, either directly as an electronic module, or positioned on a chassis which for present purposes will be considered as an electronic module, whether or not electronic components are present on the chassis. The use of electronic modules mounted in racks has the advantage of convenience during the assembly and maintenance of equipment.

Reduction in the space occupied by electronic modules has resulted in an increase in the density of contacts for connection to the modules. The reduction in space has also resulted in a need to be able to dissipate heat from the module because of the higher density of heat emitting components. This is often achieved by mounting the modules in thermal contact with a heat sink, for example a rack of a thermally conductive material such as aluminum.

In order to be able to maintain equipment which incorporates electronic modules in full working order, it is desirable to be able to remove and to replace the modules, and therefore to be able to release the modules from the contact pins and the mounting rack in which they are located when in use. Known fasteners for ensuring that the contacts on a module and its corresponding rack are engaged include a manually operated lever mounted on the module which engages a recess in the rack. This system suffers from the disadvantage however that is requires the operator to exercise skill in inserting the module in the rack, and to exert sufficient force to ensure proper engagement, but not so much force that the contacts on the module or the rack (or both), which can often be delicate, are damaged. Furthermore, there are often many connections between the module and the rack, and when these are formed as pins and sockets, the operator can often be required to exert considerable force to ensure proper engagement.

It is known also to make a heat sink link between a module and the rack in which it is mounted by means of a plurality of wedges located between the module and the rack which can be made to move towards one another by a screw so as to increase the effective depth of the wedges, thereby forcing the module against the rack. A torque limiter may be used to ensure that the required torque is applied to the wedges and is not exceeded.

A discussion of fastening devices for electronic modules is contained in Machine Design, 8th January 1987, pages 115 to 118.

SUMMARY OF THE INVENTION

We have devised a mounting assembly in which an actuator is used to cause, in sequence, insertion of a module into a rack and the creation of a heat sink link between the module and the rack.

Accordingly, in one aspect, the invention provides a mounting assembly, comprising:
 (a) an electronic module;
 (b) a rack for receiving the module, having first and second opposed surfaces between which the module can slide and having an end stop;
 (c) an actuator; and
 (d) means which are arranged to act against the first surface of the rack for forcing a surface of the module against the second surface of the rack;
the actuator being arranged to cause the module to slide along the rack into engagement with the end stop, and subsequently to actuate the forcing means.

The assembly of the invention has the advantage that wedging of the electronic module against the rack is arranged to take place automatically sequentially after the module has been inserted in the rack into engagement with the end stop. The operation of the forcing means sequentially after engagement of the module with the end stop reduces the possibility of too much or too little force being applied to the module to slide it into engagement with the end stop, and can also ensure that the module is only forced against the rack, and therefore wedged in place, once the module is fully engaged with the end stop on the rack.

The end stop may provide contacts for cooperation with electrical contacts on the electronic module to make one or more electrical connections between the rack and the module.

The rack provides first and second surfaces between which the module can slide. One surface is provided for the forcing means to act against to force the module towards the other surface to create a heat sink link. The rack may provide a plurality of alternating first and second surfaces for receiving a plurality of modules. The surfaces may be provided, for example, as ledges extending from parallel plates; the ledges may extend the entire distance between the plates or just sufficient distance to receive the module. The surfaces may also be provided as recesses cut into plates which may be disposed parallel to one another.

In order that the forcing means act to force the module against the second surface of the rack, it is necessary for it to "fill" the space between the module and the first surface of the rack. When the forcing means are mounted on, or are part of, the module, the forcing means are thus required to increase the effective thickness of the module at this point.

In order to ensure that the forcing means are actuated after the module has engaged the end stop, it is preferred that the forcing means includes at least one spring which exerts a force against that exerted by the actuator when it causes the module to be forced against the second surface of the rack, the actuator being arranged to overcome the spring after engagement of the module with the end stop.

In a preferred embodiment, the forcing means comprises a plurality of wedges located between the module and the first surface of the rack, at least one of the wedges having an oblique face such that actuation of the forcing means causes one of the wedges to move relative to the oblique face of another of the wedges, thereby forcing the module against the second surface of the rack. Preferably, the abutting surfaces of adjacent wedges are both oblique and cooperate so that one wedge can slide above its neighbor.

The forcing means may be attached to or be formed as part of either the module or the rack. For example when the forcing means comprises a plurality of wedges, one of the wedges may be attached to the module or the rack, and the other wedge or wedges would then be movable relative to the fixed wedge to force the module and the rack together.

In a particularly preferred embodiment, the forcing means comprises three wedges. One wedge is fixed to the module or to the rack. A wire of a shape memory alloy is attached towards one end to the fixed wedge and towards its other end to a movable wedge. The facing surfaces of the fixed and movable wedges are oblique in opposite senses. A middle wedge is located between the fixed and movable wedges and has oblique end faces which compliment the respective end faces on the fixed and movable wedges. Recovery of the shape memory alloy wire thus causes the movable wedge to move towards the fixed wedge so that the middle wedge is squeezed laterally from between the fixed and movable wedges.

In another embodiment, the forcing means comprises a rotatable cam located between the module and the first surface of the rack and mounted so that the distance from its axis of rotation to its perimeter is non-uniform around the perimeter. For example, the cam may be mounted eccentrically or it may be non-circular, for example oval.

It is preferred that the actuator comprise a pivotable lever and a recess for engaging the lever, arranged so that pivotal movement of the lever is converted into linear movement of the module. The lever will generally have an elongate portion for engaging the recess. The lever and recess will preferably be provided on the module and rack respectively, for ease of maintenance, although the opposite arrangement may alternatively be used.

Preferably, the lever of the actuator engages the recess, for example under a spring load, when the module is initially inserted into the rack so that when, subsequently, the lever is pivoted, the module is caused to slide in the rack into engagement with the end stop.

It is particularly preferred that the actuator comprise a shape memory alloy element. Shape memory alloys are capable of exhibiting changes in strength and configurational characteristics on passing through a transition temperature, generally the transition temperature between the martensitic and austenitic phases. This allows shape memory alloys to be used to make an article which is dimensionally recoverable, that is an article which recovers towards an original shape from which it has previously been deformed. In the case of a shape memory alloy, recoverable properties are imparted by deformation while in the martensitic, low temperature phase. The alloy will then retain its deformed configuration until it is warmed above the transition temperature where it reverts to the austenitic, high temperature phase, when it will recover towards it original configuration.

The shape memory alloy element may be used to impart movement to the module by causing the pivotable lever to pivot. It may also be used to actuate the forcing means; for example when the forcing means comprises wedges, it can be used to move one or more wedges towards one another, against the counter force provided by a spring when present. When the forcing means comprises a cam, the shape memory alloy element may be used to rotate the cam. The link or links between the shape memory alloy element and the other components of the actuator or the forcing means may be direct or may be indirect, for example through connecting members.

The use of a shape memory alloy element in this particular application has the advantage that it is able to exert a predetermined force reproducibly for moving the module towards the end stop and for forcing the module and the rack together. Operator error in the amount of force applied, and also in the sequence with which force is applied to move the module and to make the heat sink link, can be reduced significantly by this.

The use of a shape memory alloy element has the further advantage that it can conveniently be arranged that the module is inserted into the rack straight. This ensures that the delicate components which make the electrical connection between the module and the rack (for example pins and sockets) are not distorted unduly. Furthermore, it ensures that the module can slide smoothly in the rack. This can be achieved by providing two shape memory alloy elements, one on each side of the module or rack, and by ensuring that they recover at the same rate, preferably by electrically connecting the elements in series and passing an electric current through them so as to cause them to heat up and to recover.

The use of a shape memory alloy element also has the advantage that it is possible to actuate the assembly remotely, for example by closing an electrical circuit which contains the shape memory alloy element, and thereby causing the temperature of the element to increase and causing it to recover.

Preferably, when a shape memory alloy element is used, the assembly includes a means for protecting the element against overload, in particular when the module is fully inserted in the rack and is forced strongly against the first surface of the rack. In these circumstances, continued recovery of the element can cause permanent deformation. Overload protection may be provided by springs which are arranged only to be deformed when the module is fully inserted into, and forced against, the rack. In addition to reducing the direct risk of overloading the shape memory alloy element, the provision of overload protection means has the advantage that a module can be accomodated in racks with a range of dimensions. Thus the tolerances to which the rack and the module have to be manufactured are not as critical as they might otherwise be. Heat may be applied to the shape memory alloy element to cause it to recover from an external heat source, for example from an adjacent Nichrome wire. It is particularly preferred however that the shape memory alloy element be heated by the passage of electric current through it.

Alternatively, a shape memory alloy element may be used which has a martensite-austenite transformation temperature below ambient temperature, and which therefore exists in the recovered state at ambient temperature. Insertion and/or removal of the module from rack will in this case be carried out by cooling the shape memory alloy element so that it reverts to the martensitic phase. This embodiment has the advantage that it is not necessary to employ a latch to retain the module in the inserted position.

In another aspect, the present invention provides a mounting assembly which comprises:

(a) an electronic module;

(b) a rack, having an end stop, on which the module can slide; and (c) an actuator comprising a member for engaging the module with the rack and a shape memory alloy element which on recovery is arranged to move the member so as to cause the module to slide along the rack into engagement with the end stop.

In a further aspect, the invention provides a mounting assembly which comprises:

(a) an electronic module;

(b) a rack for receiving the module, having first and second opposed surfaces between which the module can slide;

(c) means which can act against the first surface of the rack for forcing a surface of the module against the second surface of the rack; and (d) an actuator comprising a shape memory alloy element for actuating the forcing means.

Preferably, the shape memory alloy element is mounted on the module. In this case, it is preferred that the module has electrical contacts for receiving electrical power for heating the shape memory alloy element. It is particularly preferred that the rack includes electrical contacts for cooperation with the corresponding contacts on the module for supplying electrical power to the module. This has the advantage that the shape memory alloy element is heated automatically when the module is inserted in the rack and the connection between the contacts on the module and on the rack is made. Actuation to cause the module to slide along the rack to the end stop, and to force the module against the surface of the rack, then follows.

It is preferred that the assembly includes a latch to latch the module in place after actuation of the forcing means. Preferably, latching is effected by the actuator. The provision of a latch has the advantage that the wedging of the module by the force means need not be affected adversely by relaxation of the actuator, for example of the shape memory alloy element.

In yet another aspect, the present invention provides an electronic module for insertion into a rack, which comprises a pivotable lever, in use for engaging a recess in the rack, a shape memory alloy element which acts on the lever and which, on recovery of the element, causes the lever to pivot, and wedging means which, on recovery of the element, can be made to move so as to increase the effective thickness of the module.

BRIEF DESCRIPTION OF THE DRAWINGS

FIG. 1 shows a cross-section through a mounting assembly comprising a module and a rack, the module being positioned in the rack;

FIG. 2 shows the mounting assembly of FIG. 1 with the module fully inserted in the rack; and FIG. 3 shows the mounting assembly of FIGS. 1 and 2 with the module forced against surface of the rack; and FIG. 4 is a schematic plan view of the module shown in FIGS. 1 to 3 before insertion in the rack;

FIG. 5 is a schematic circuit diagram for supplying electrical power to the shape memory alloy wires of the module; and FIG. 6 is an elevational view of a second embodiment of module.

DESCRIPTION OF PREFERRED EMBODIMENTS

FIG. 1 shows a mounting assembly which comprises an electronic module 2, such as a printed circuit board, and a rack 4. The rack 4 provides first and second surfaces 6,8 between which the module is inserted, and an end wall 10 which serves as an end stop and provides contacts 11 for making an electrical connection with cooperating contacts 13 on an end wall 12 of the module 2. For example the end walls on the rack and the module may provide pins and sockets respectively.

The assembly comprises a shape memory alloy wire 14 which is connected at one end 16 to the module, and which acts, via first and second springs 18,20 and a connecting arm 22, on a lever 24 which is pivotally mounted on the module. The connecting arm 22 is acted on by a third spring 26, which acts against the force exerted by the shape memory alloy wire 14 when it recovers.

The assembly also comprises a plurality of wedges which are arranged to act against the first surface 6 of the rack to force a surface 45 of the module 2 against the second surface 8 of the rack 4.

A first wedge 28 is provided as part of the module, and presents an oblique face 30. A second wedge 32 is provided which is movable relative to the first wedge 28 and also presents an oblique face 34. A middle wedge 36 is located between the first and second wedges and presents oblique faces 38 complementary to the oblique faces 30,34 on the first and second wedges, so that when the second wedge 32 is moved towards the first wedge 28, the middle wedge 36 is urged out from between the first and second wedges. The first and second wedges are biased apart by a spring 40.

The second wedge 32 is acted on by the wire 14 through the first spring 18 and a connecting member 42. The connecting member 42 engages a ratchet type latch 44 which is itself pivotally mounted on the module.

In use, the module is inserted between the first and second surfaces 6,8 of the rack 4, with the shape memory alloy wire 14 in the martensitic phase. The wire is then heated, for example by the passage of electric current through it, or allowed to warm to ambient temperature, to cause it to recover. In so doing, the wire contracts longitudinally, and overcomes the biasing force exerted by the third spring 26 (which is arranged to be weaker than that exerted by the first and second springs 18,20). The connecting arm 22 is thus caused to move and to pivot the lever 24 so that it engages a recess 46 in the first surface 6 of the rack. Continued recovery of the wire 14 then causes the module to slide along the rack, left to right as shown, into the position shown in FIG. 2 where a connection between the contacts on the end walls 10,12 of the rack and of the module rack is made.

Continued recovery of the wire 14 after the said connection has been made causes the module to be forced against the second surface 8 of the rack. By selection of suitable materials, this can be used to create a heat-sink link to the rack. Thus on recovery of the wire, the connecting member 42 is caused to move longitudinally of the wire so as to move the second wedge 32 towards the first wedge 28. Movement of the connecting member 42 is against the force exerted by the second spring 20 (which is arranged to be weaker than that exerted by the first spring 18). By the configuration of the oblique surfaces on the first, middle and second wedges, the middle wedge 36 is forced laterally of the wire 14 against the first surface 6 of the rack so that the surface 45 of the module is forced against a second surface 8 of the rack. As the connecting member 42 moves, it engages, and is locked against, successive teeth of the latch 44.

The installed module is shown in FIG. 3.

The first spring 18 is provided to protect the wire 14 against overload; it may be deformed by the wire once the module is fully inserted in the rack and the wedges are moved fully.

Release of the module from its installed position as shown in FIG. 3 can be achieved by pivoting the latch 44 so as to disengage the connecting member 42. The latch can be dispensed with by using a wire of a shape memory alloy having a transition temperature which is lower than ambient temperature. In this case, the module can be released by lowering the temperature of the wire to below its transition temperature.

Preferably the mounting assembly is arranged so that the forces exerted on the module relative to the frame are symmetrical of the module. This may be achieved conveniently by the use of two wires with associated springs, wedges, levers and latches, one on each side of the module.

FIG. 4 shows a module 51 which uses two shape memory alloy wires 55, each extending along an edge of the module. The shape memory alloy wires 55 each act on a plurality of wedges 53 in the manner described above in connection with FIGS. 1 to 3. Details of the springs, connecting arm and lever have been omitted for clarity.

FIG. 5 shows a circuit diagram which might be used to supply electrical power to shape memory alloy wires 61 on a module 63. The module has contacts 65 on an end face for mating with contacts 67 on a wall of the rack 69. As can be seen, the wires 63 are connected in series.

FIG. 6 shows another embodiment of a module 73 located in a rack 71. The rack is provided with a mounting 75 for a non-round rotatable cam 77. The distance from the axis of rotation of the cam to its perimeter is non-uniform around the perimeter. A shape memory wire 79 extends between a fixed stop 81 and the cam. On recovery, the wire causes the cam to rotate about its axis, forcing the module 73 against the rack 71.

While the figures show the wire and associated other components as mounted on the module and acting on the rack, as preferred for ease of assembly and maintenance, the reverse arrangement may be used.

What is claimed is:

1. A mounting assembly which comprises:
   (a) an electronic module;
   (b) a rack receiving the module, having first and second opposed surfaces between which the module is received and can slide, and the rack having an end stop;
   (c) forcing means on the module or the rack which can act against the first surface of the rack and force a surface of the module against the second surface of the rack; and
   (d) an actuator mounted on one of the rack and the module having a single means for causing the module to slide along the rack into engagement with the end stop, and for subsequently actuating the forcing means.

2. An assembly according to claim 1, in which the forcing means includes a least one spring which exerts a force against that exerted by the actuator when it causes the module to be forced against the second surface of the rack, the force exerted by the actuator overcoming that exerted by the spring once the module has engaged the end stop.

3. An assembly as claimed in claim 1, in which the forcing means comprises a plurality of wedges located in use between the module and the first surface of the rack, at least one of which has an oblique face such that actuation of the forcing means causes one of the wedges to move relative to the oblique face of another of the wedges, thereby forcing the module against the second surface of the rack.

4. An assembly as claimed in claim 1, in which the forcing means comprises a rotatable cam which is located in use between the module and the first surface of the rack mounted with its axis of rotation in a plane parallel to the said first surface so that the distance from the axis of the rotation of the cam to its perimeter is non-uniform around the perimeter.

5. An assembly as claimed in claim 1, in which the actuator comprises a pivotable lever that is engageable in a recess, one of the lever and the recess being located on the module and the other being located on the rack, so that pivotal movement of the lever is converted into sliding movement of the module, between the said first and second surfaces.

6. An assembly as claimed in claim 5, in which the pivotable lever is mounted on the module, and the recess is formed on the rack.

7. An assembly as claimed in claim 1, in which the actuator comprises a shape memory alloy element.

8. An assembly as claimed in claim 7, in which the shape memory alloy element is mounted on the module, and the module has electrical contacts for receiving electrical power for heating the shape memory alloy element.

9. An assembly as claimed in claim 8, in which the rack includes contacts for cooperation with the corresponding contacts on the module for supplying electrical power to the module.

10. An assembly as claimed in claim 1, which includes means for latching the module in place after actuation of the forcing means.

11. A mounting assembly as claimed in claim 7, in which the actuator comprises two shape memory alloy elements, mounted one on each side of the rack.

12. A mounting assembly as claimed in claim 11, in which the shape memory alloy elements are electrically connected in series.

13. An electronic module for insertion into a rack, which comprises a pivotable lever, in use for engaging a recess in the rack, a shape alloy element which is operatively connected to the lever and which, on recovery of the element, causes the lever to pivot, and wedging means which, on recovery of the element, move so as to increase the effective thickness of the module.

14. A mounting assembly which comprises:
   (a) an electronic module;
   (b) a rack, having an end stop, on which the module is received and can slide; and
   (c) an actuator comprising a member on the module or the rack which, can operatively connect the module to the rack, and a shape memory alloy element which, on recovery, moves the member so as to cause the module to slide along the rack into engagement with the end stop.

15. A mounting assembly as claimed in claim 14, in which the shape memory alloy element is located on the module and the module and the rack include cooperating contacts for supplying electrical power from the rack to the module for heating the shape memory alloy element to cause it to recover.

16. A mounting assembly as claimed in claim 14, in which the member comprises a pivotable lever that is engageable in a recess, one of the lever and the recess being located on the module and the other being located on the rack, the shape memory alloy element, on recovery, causing the lever to pivot so as to cause the module to slide as aforesaid.

17. A mounting assembly which comprises:
 (a) an electronic module;
 (b) a rack having first and second opposed surfaces between which the module is received and can slide;
 (c) forcing means on the module or the rack which can act against the first surface of the rack and force a surface of the module against the second surface of the rack; and
 (d) an actuator comprising a shape memory alloy element for actuating the forcing means, the actuator being connected to the forcing means.

18. A mounting assembly as claimed in claim 17, in which the shape memory alloy element is located on the module and the module and the rack include cooperating contacts for supplying electrical power from the rack to the module for heating the shape memory alloy element to cause it to recover.

19. A mounting assembly as claimed in claim 17, in which the forcing means comprises a plurality of wedges located in use between the module and the first surface of the rack, at least one of which has an oblique face such that, on recovery of the shape memory alloy element, one of the wedges moves relative to the oblique face of another of the wedges, thereby forcing the module against the second surface of the rack.

* * * * *